United States Patent
Sirichotiyakul et al.

(10) Patent No.: US 6,799,153 B1
(45) Date of Patent: Sep. 28, 2004

(54) CROSS COUPLING DELAY CHARACTERIZATION FOR INTEGRATED CIRCUITS

(75) Inventors: Supamas Sirichotiyakul, Austin, TX (US); David T. Blaauw, Austin, TX (US); Chanhee Oh, Cibolo, TX (US); Vladimir P. Zolotov, Austin, TX (US); Rafi Levy, Tel Aviv (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 09/553,271

(22) Filed: Apr. 20, 2000

(51) Int. Cl.$^7$ .............................................. G06F 17/50
(52) U.S. Cl. ................... 703/19; 703/16; 716/6
(58) Field of Search ....................... 703/14, 16, 19; 716/6, 4, 7, 8, 5

(56) References Cited

U.S. PATENT DOCUMENTS

| | | | | |
|---|---|---|---|---|
| 5,568,395 | A | * | 10/1996 | Huang ......................... 364/489 |
| 6,128,769 | A | * | 10/2000 | Carlson et al. ................. 716/6 |
| 6,212,490 | B1 | * | 4/2001 | Li et al. ........................ 703/14 |
| 6,378,109 | B1 | * | 4/2002 | Young et al. ................... 716/4 |
| 6,407,574 | B1 | * | 6/2002 | Wen et al. ..................... 326/21 |
| 6,499,129 | B1 | * | 12/2002 | Srinivasan et al. ............. 716/4 |
| 6,499,131 | B1 | * | 12/2002 | Savithri et al. ................. 716/5 |

OTHER PUBLICATIONS

Florentin Dartu, et al., "Calculating Worst–Case Gate Delays Due to Dominant Capacitance Coupling," © 1997 ACM 0–89781–920–3/97/06, pp. 46–51.

* cited by examiner

Primary Examiner—Thai Phan
(74) Attorney, Agent, or Firm—Joanna G. Chiu (57) ABSTRACT

A solution to perform cross coupling delay characterization for integrated circuits and other microprocessor applications. The invention properly models the integrated circuit in various configurations at various times to accommodate the non-linearities associated with driver circuitry and the undesirable capacitive coupling between nets within the integrated circuit, specifically those that are located within close proximity to one another and that generate deleterious effects of the transitions of the drivers from low to high, and from high to low. The invention provides for a computationally efficient solution to perform the delay characterization of the speeding up and slowing down of individual transition operations within the microprocessor. Accurate delay characterization provides for design engineers an accurate description of the worst case and best case scenarios of the integrated circuit or microprocessor that is needed for various applications such as the integration of the integrated circuit and microprocessor into a larger system.

43 Claims, 6 Drawing Sheets

CROSS COUPLING DELAY CHARACTERIZATION FOR INTEGRATED CIRCUITS

FIELD OF THE INVENTION

The present invention relates generally to integrated circuit delay characterization; and, more particularly, it relates to delay characterization that is attributable to electrical interference due to cross coupling capacitance within integrated circuits.

RELATED ART

Conventional methods that are used to perform delay characterization of integrated circuits fail to provide accurate measurement and subsequently inhibit the ability of designers to integrate properly various integrated circuits within a system. In addition, the inability to provide accurate delay characterization of integrated circuits provides an undesirability, in that, manufacturers are incapable of giving detailed specification for their integrated circuits within a high degree of accuracy.

The difficulty in estimating the worst case delay in the presence of noise within an integrated circuit is complicated by the intrinsic non-linearities of the gates driving the nets within an integrated circuit. This intrinsic non-linearity within the system necessitates significant processing resources using conventional non-linear circuit analysis tools such a Spice, P-Spice, etc. This processing is further complicated, in that, the total number of linear elements of the entire integrated circuit is typically very large. Within integrated circuits that have undesirable parasitic cross-coupling, the alignment of the transition times between victim and aggressor devices is additionally very difficult. Another difficulty is that the alignment of what is thought to be a worst-case delay at a receiver input within the integrated circuit does not always yield the worst case delay at the same receiver output within the integrated circuit. Many conventional methods to perform delay characterization focus on characterization at the receiver input.

Conventional methods that attempt to model the delay of integrated circuits generally fail to provide the degree of accuracy that is desired within the industry. One conventional method involves grounding the coupling capacitors between devices within the integrated circuit. However, this conventional method typically underestimates the worst case delay of the integrated circuit. Another conventional method involves increasing the value of grounded capacitors by a predetermined value, i.e., by a factor of two (2x). However, this conventional method is typically not very conservative, in that, the increase of the real value of the grounded capacitors could be as high as a factor of five (5x). In addition, this conventional method may overestimate the delay on some nets thereby yielding a sub-optimal design. Another conventional method involves manual manipulation of the known critical nets within an integrated circuit using conventional circuit analysis tools such a Spice, P-Spice, etc. The problems with this conventional method are many, in that, the simulation time required to perform these manual manipulations can be extremely large. In addition, the manual intervention of this conventional method may result in missing what were thought to be non-critical nets when they do in fact become critical nets due to the noise. Furthermore, the inherent manual intervention of this conventional method requires an exhaustive search to find the worst case delay within the integrated circuit.

Another conventional method uses the alignment of noise to obtain a 50% delay at the victim receiver input. This conventional method is easy to be done using superposition. However, as briefly described above, those conventional methods that look only to the victim receiver inputs inherently ignore the effect of the victim receiver and therefore can result in improper delay alignment. Also, to minimize the complexity of the analysis performed with this conventional method, the method uses a standard Thevenin linear gate model for the victim driver which tends to underestimate delay changes. The use of the standard Thevenin linear gate model for the victim driver is simply an inaccurate representation of the victim driver. The conventional methods described above that perform delay characterization simply do not provide for a highly accurate, computationally efficient way to perform the delay characterization of integrated circuits.

Further limitations and disadvantages of conventional and traditional systems will become apparent to one of skill in the art through comparison of such systems with embodiments of the present invention as set forth in the remainder of the present application with reference to the drawings.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
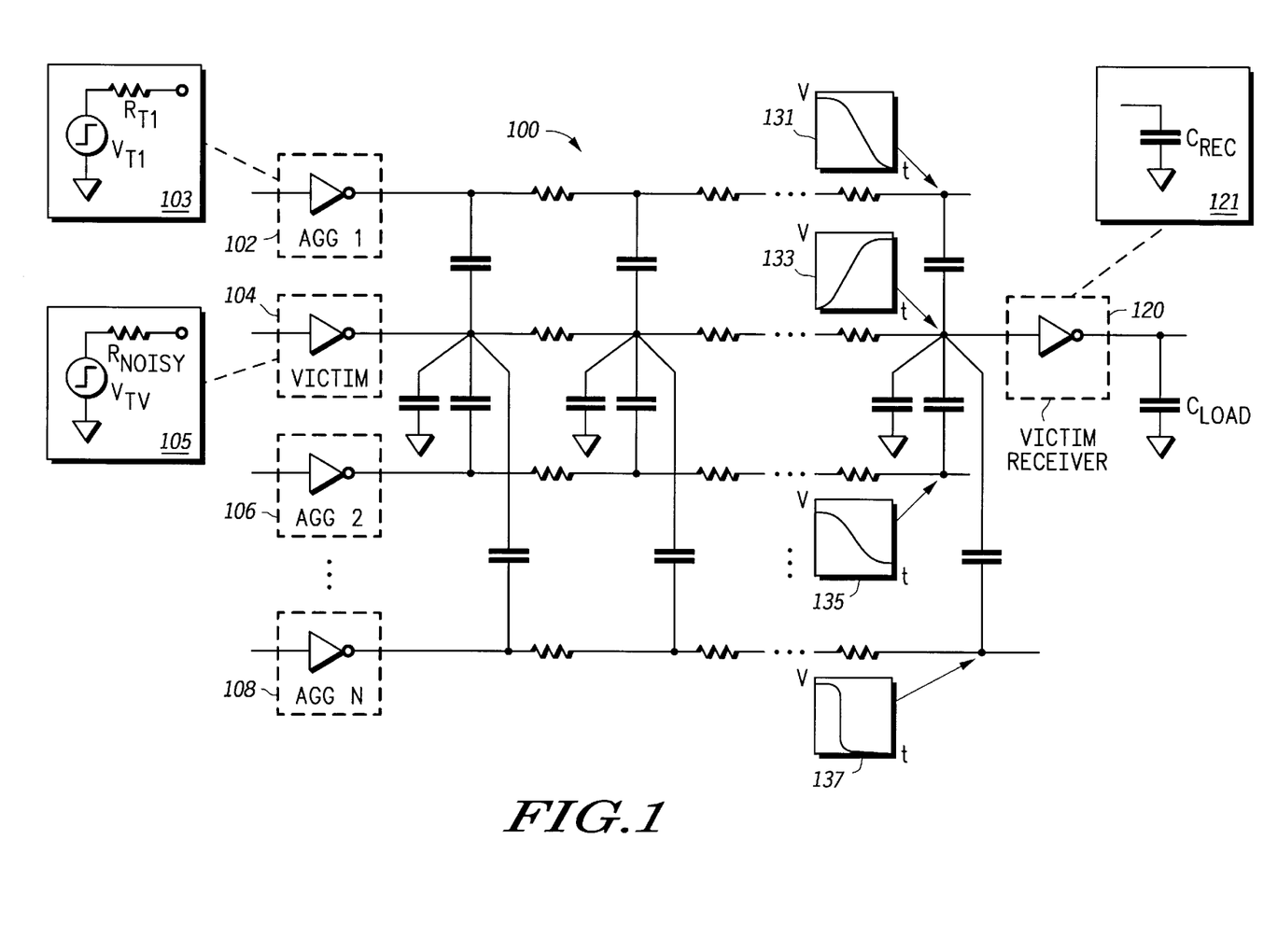
FIG. 1 is a system diagram illustrating one embodiment of a model to perform delay characterization of an integrated circuit in accordance with the present invention.

FIG. 1 is a system diagram illustrating one embodiment of a model 100 to perform delay characterization of an integrated circuit in accordance with the present invention. The model 100 is generated from a portion of an integrated circuit that contains a victim driver 104 and a victim receiver 120 that are communicatively coupled via a net. The net is viewed as the electrical interconnectivity between various elements of the integrated circuit. The net is itself a trace on a circuit board or a trace within an integrated circuit in certain embodiments of the invention. In addition, other nets are located in close proximity to the net that communicatively couples the victim driver 104 and the victim receiver 120.

A net is said to be driven by a device if an output of that device is connected to the net. Such a device is also called a net driver. An aggressor net driven by an aggressor driver 102 is located within close proximity of the victim net driven by the victim driver 104. The close proximity of these two nets (the net driven by the aggressor driver 102 and the net driven by the victim driver 104) results in capacitive coupling between the nets when both of the nets are active, i.e., changing in voltage potential. This undesirable capacitive coupling can result in deleterious effects associated with the operation of the victim driver 104. For example, the transition times of the victim driver 104 can be compromised because of the undesirable capacitive coupling between the traces. In some cases, the transitions can be accelerated, and in others, the transitions can be delayed. In either case, the result can be a mischaracterization of the actual performance of the integrated circuit housing the aggressor driver 102 and the victim driver 104.

Within the integrated circuit, multiple coupling capacitors are included to illustrate the parasitic capacitance between nets within the integrated circuit, and multiple grounded capacitors are included to illustrate the parasitic capacitance between the layer on which the net is located and the bottom layer of the integrated circuit. In addition, multiple segments of resistance are included to illustrate the parasitic accumulation of resistance along the length of the net between the victim driver 104 and the victim receiver 120.

As briefly mentioned above, the victim driver 104 is affected by the undesirable cross coupling between adjacent nets, represented by the net driven by an aggressor driver 1 102, the net driven by an aggressor driver 2 106, and the net driven by an aggressor driver N 108. Any number of aggressor drivers are included without departing from the scope and spirit of the invention, yet the modeling of the integrated circuit may be performed when there is only a single aggressor driver (i.e., the aggressor driver 1 102). In the event that multiple aggressor nets are in fact within close proximity to the victim net driven by the victim driver 104, the effect of the first aggressor driver, the aggressor driver 1 102, is first determined. Then, the effect of a second aggressor driver, the aggressor driver 2 106, is then determined. For an indefinite number of aggressor drivers, the effect of an Nth aggressor driver, the aggressor driver N 108, is then determined. After the effects of each of the multiple aggressor drivers are determined, they are then summed using linear superposition to determine the total effect of multiple aggressor drivers on the victim driver 104. Empirically, the use of linear superposition has been shown to be a good method to model the effects of multiple aggressor drivers.

The transitions caused by each of the drivers (the aggressor driver 1 102, the victim driver 104, the aggressor driver 2 106, and the aggressor driver N 108) are shown within a number of blocks 131, 133, 135, and 137, respectively. The specific embodiment shown in the FIG. 1 shows the transition of the aggressor driver 1 131 to be from high to low whereas the transition of the victim driver 133 in the opposite direction, low to high. This represents one situation where there can be resulting undesirable electric interference due to capacitive coupling that affects the timing characterization of the integrated circuit. Circuit performance in other situations can also be characterized in a similar fashion without departing from the scope and spirit of this invention. The transition of the aggressor driver 2 135 is also shown to be from high to low, as is the transition of the aggressor driver N 137. The transition of the aggressor driver 2 135 and the transition of the aggressor driver N 137 are shown to be different, as is often the case since the actual transition shape, speed, and overall time, are all unique functions of the drivers themselves. Since various types of drivers are used in integrated circuits, there is a high likelihood that some of the transitions of cross coupled devices will be different, and the invention provides a manner to perform proper characterization of the integrated circuit's performance even in this event.

The victim receiver 120 provides a signal to a capacitive load ($C_{LOAD}$). In accordance with an embodiment of the present invention, the aggressor driver 1 102 is modeled using a Thevenin equivalent circuit 103 having a switching voltage supply ($V_{T1}$) and a linear Thevenin resistance ($R_{T1}$). The victim driver 104 is modeled using a Noisy circuit 105 having a switching voltage supply ($V_{TV}$) and a Noisy resistance ($R_{NOISY}$). The Noisy resistance ($R_{NOISY}$) will be shown to be a combination of multiple resistances as illustrated within various embodiments of the invention. The victim receiver 120 is modeled using a victim receiver model circuit 121 of a shunt capacitor to ground ($C_{REC}$). In the event that the cumulative effect of multiple aggressors are to be modeled, models similar to the Thevenin equivalent circuit 103 are used for each of the aggressor driver 2 106, and the aggressor driver N 108. The model 100 is illustrative to show how various portions of the integrated circuit are modeled to provide an overall model for accurate characterization of the integrated circuit in accordance with the present invention.

Figure 2:
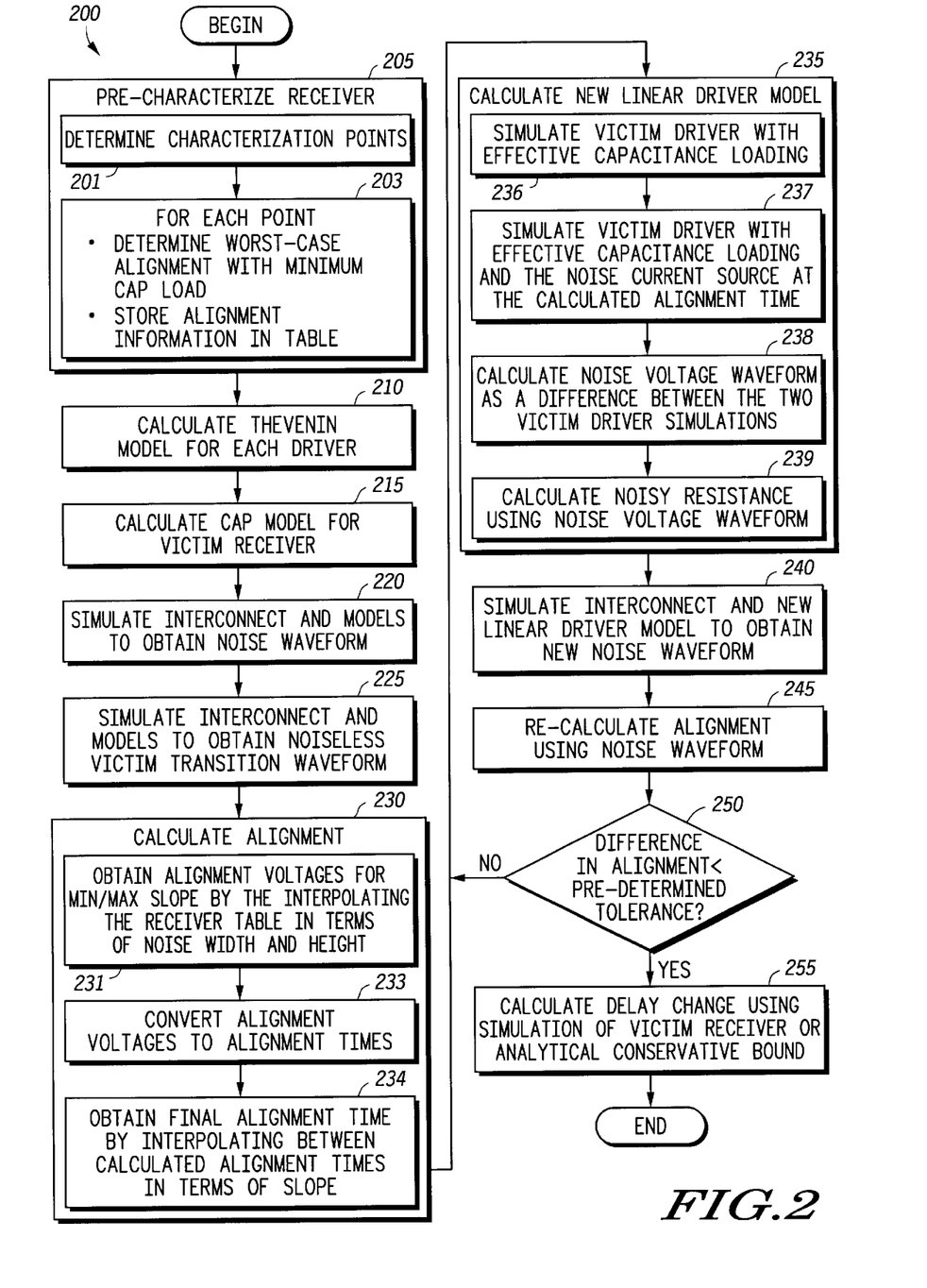
FIG. 2 is a functional block diagram illustrating one embodiment of a cross coupling delay characterization method that is performed in accordance with the invention.

FIG. 2 is a functional block diagram illustrating one embodiment of a cross coupling delay characterization method 200 that is performed in accordance with the invention. In a block 205, a receiver is pre-characterized. The physical characteristics of the receiver are considered in the characterization of the block 205. In addition within the block 205, characterization points for the receiver are determined in a block 201 and for each of the determined characterization points, the worst case alignment with a minimum capacitive load is determined and the alignment information is stored for subsequent use in a block 203 in a receiver table. Then, in a block 210, a Thevenin model is calculated for each of the drivers. This includes calculating a Thevenin model for all of the drivers within the integrated circuit, including both aggressors and victims. Then, in a block 215, a capacitor model is calculated for the receiver, i.e., the victim receiver in certain embodiments of the invention. The interconnects between the models are simulated in a block 220 to obtain a noise waveform indicative of the timing of noise in the integrated circuit. Similarly and subsequently, in a block 225, the interconnects between the models are simulated to obtain a noiseless victim transition waveform indicative of the timing of the integrated circuit.

Then, in a block 230, the alignment of the drivers is calculated. Within the block 230, the alignment voltages, corresponding to the alignment time, for the maximum and minimum slope transitions are calculated by interpolating within the receiver table in terms of noise width and height. The receiver table is that receiver table generated above in the block 203. Then, the alignment voltages are actually converted to alignment times in a block 233. Here, the alignment voltages and the alignment times have a one to one correspondence within the receiver table; the use of alignment voltages makes linear interpolations feasible and provides for more efficient allocation of processing resources in accordance with embodiments of the present invention when compared to traditional methods that attempt to perform delay characterization. Then, within a block 234, the final alignment times are obtained by interpolating between the calculated alignment times in terms of slope within the receiver table.

Within a block 235, a new linear driver model is calculated. This involves simulating the victim driver with an effective capacitive loading in a block 236. A waveform at the victim driver output node is recorded. Then, this involves simulating the victim driver with an effective capacitive loading and a noise current source at the calculated alignment time in a block 237. Again, a waveform at the victim driver output node is recorded. Within a block 238, the noise voltage waveform is calculated as a difference of the resultant waveforms from block 236 and block 237. Finally within the block 239, a Noisy resistance ($R_{NOISY}$) is calculated using the noise voltage waveform. The Noisy resistance ($R_{NOISY}$) is that which is used to model the victim driver in various embodiments of the invention.

After the calculations of the block 235 have been completed, the interconnects between the models and the new linear model driver are simulated in a block 240 to obtain a new noise waveform indicative of the timing of noise in the integrated circuit. Then, in a block 245, the alignment is re-calculated using the noise waveform generated in the block 240. This includes performing a calculation similar to that in the block 230.

In a decision block 250, it is determined if the difference in alignment from the last iteration is below a predetermined tolerance or threshold. If the alignment difference is not below the predetermined tolerance or threshold as determined within the block 250, then the cross coupling delay characterization method 200 resumes with the operation shown within the block 235 to try to arrive at convergence. However, if it is determined that convergence is in fact achieved as determined by the decision block 250, then in a block 255 the delay change is calculated using simulation of the victim receiver or an analytical conservative bound in accordance with embodiments of the present invention.

Figure 3:
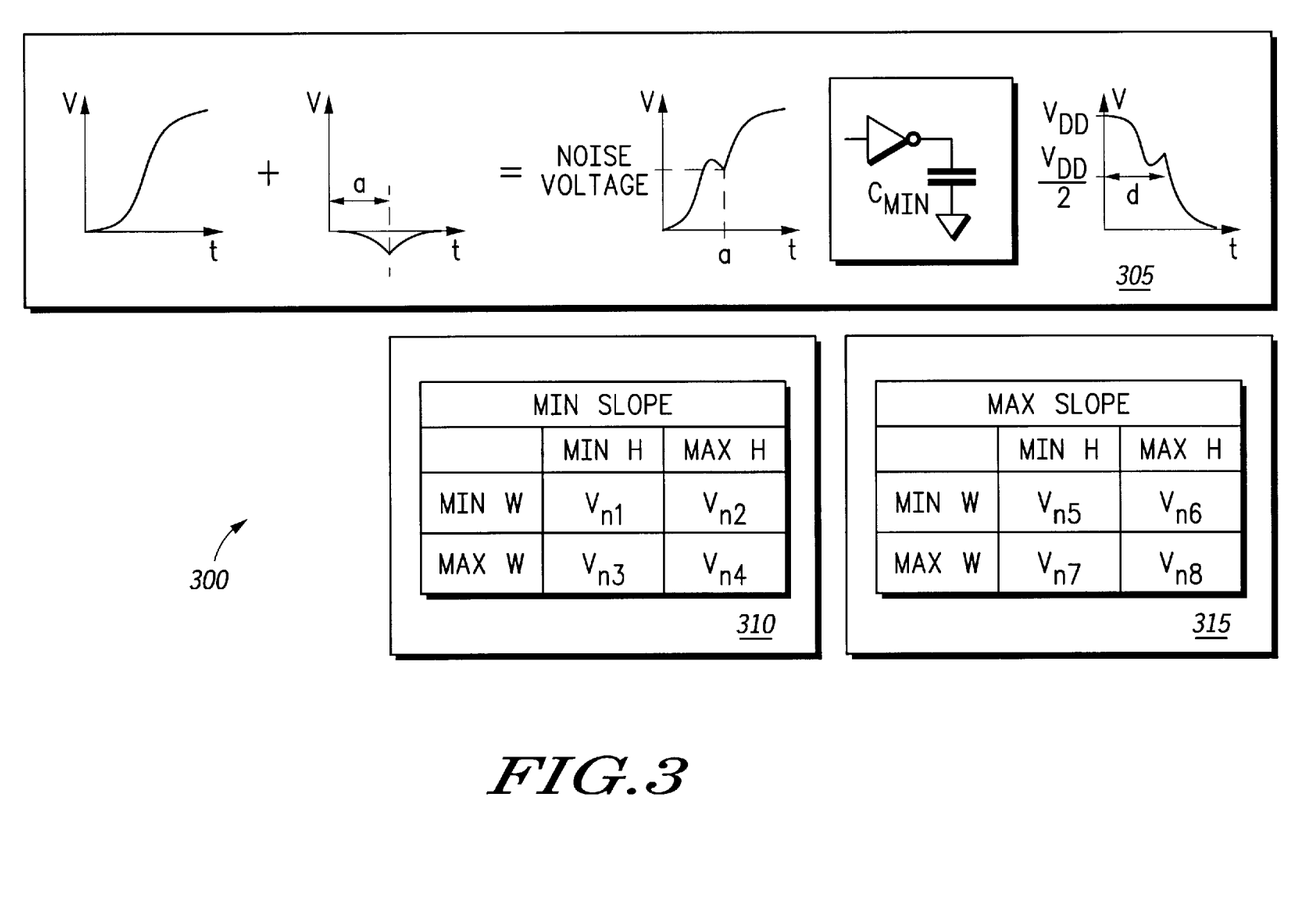
FIG. 3 is a diagram illustrative of one embodiment of a pre-characterization of a victim receiver that is performed in accordance with the cross coupling delay characterization method of the FIG. 2.

FIG. 3 is a diagram illustrative of one embodiment of a pre-characterization of a victim receiver 300 that is performed in accordance with the cross coupling delay characterization method 200 of the FIG. 2. In a block 305, a transition from low to high is shown for the victim receiver. The low to high transition is summed with a predetermined undesirable capacitive coupling noise waveform having a negative peak at a predetermined noise alignment time "a". When both of these waveforms are summed together in the block 305, the resultant summed waveform has an anomaly during the low to high transition with voltage value at its peak (NOISE VOLTAGE) at the noise alignment time "a". This summed waveform, after being passed through the victim receiver modeled as having a minimum capacitor to ground load ($C_{MIN}$) is shown to have an output voltage waveform that appears as an inverse of the summed waveform. The output delay "d" is measured as the time at which the output voltage waveform has the value of a half maximum voltage ($V_{DD}/2$). For a given victim receiver, a given transition slope, a given noise height, and a given noise width, this pre-characterization of the victim receiver 300 is done multiple times, each with a different value of the noise alignment time "a". Among these multiple pre-characterization simulations, the noise alignment time corresponding to the simulation with the largest output delay is found. Then, the NOISE VOLTAGE associated with the simulation whose output delay is smaller than the largest output delay by a predefined percentage value (approximately 5% in this embodiment), and whose noise alignment time is smaller than the alignment time of the simulation with the largest output delay is recorded.

This pre-characterization of the victim receiver 300 is performed multiple times to generate a three dimensional look up table (LUT) illustrated by blocks 310 and 315. In the block 310, for a minimum slope of the transition of the victim receiver, voltage values associated with the output delay that is 5% smaller than the largest output delay are generated and stored for a minimum and maximum height of the noise waveform corresponding to a minimum noise width, as shown by the entries $V_{n1}$ and $V_{n2}$, respectively. Similarly, voltage values associated with the output delay that is 5% smaller than the largest output delay are generated and stored for a minimum and maximum height of the noise waveform corresponding to a maximum noise width, as shown by the entries $V_{n3}$ and $V_{n4}$, respectively, within the block 310.

The pre-characterization of the victim receiver 300 is continued to be performed to map out the voltages corresponding to transitions of maximum slope to be stored in the look up table (LUT) as shown in the block 315. In the block 315, for a maximum slope of the transition of the victim receiver, voltage values associated with the output delay that is 5% smaller than the largest output delay are generated and stored for a minimum and maximum height of the noise waveform corresponding to a minimum noise width, as shown by the entries $V_{n5}$ and $V_{n6}$, respectively. Similarly, voltage values associated with the output delay that is 5% smaller than the largest output delay are generated and stored for a minimum and maximum height of the noise waveform corresponding to a maximum noise width, as shown by the entries $V_{n7}$ and $V_{n8}$, respectively, within the block 315.

These eight critical voltage values have been shown, empirically, to provide an accurate characterization of the victim receiver. Interpolation within the three dimensional look up table (LUT) illustrated by the blocks 310 and 315 is shown to provide sufficient resolution for accurate timing delay characterization of an integrated circuit when considering the undesirable effects of capacitive coupling between nets. While these eight voltage values have been described as associated with the output delay that is 5% smaller than the largest output delay, alternate embodiments may determine these voltage values differently. For example, they may be associated instead with the largest output delay, or they may be associated with an output delay that falls within a predetermined range based upon the largest output delay. Furthermore, in developing the pre-characterization table, the minimum parasitic loading effect, $C_{MIN}$, is used in modeling the victim receiver. This minimum capacitive loading is generally the most sensitive to noise alignment, and therefore this same $C_{MIN}$ can be used in obtaining all eight critical voltage values described above.

Figure 4:
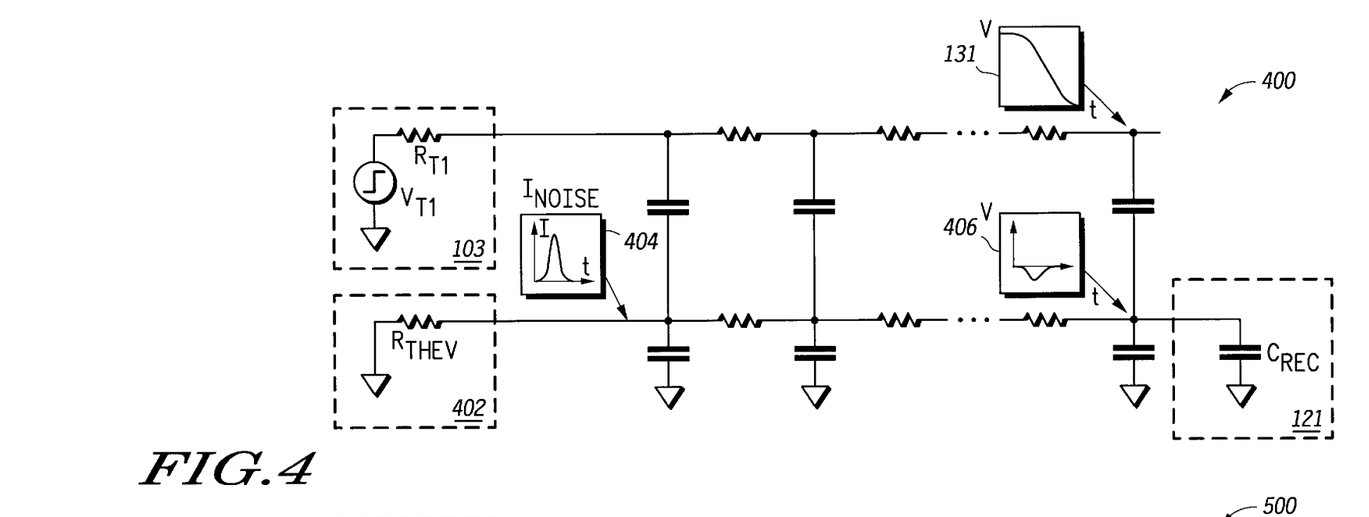
FIG. 4 is a diagram illustrative of one embodiment of a simulation of interconnects and models to obtain a noise waveform in accordance with the cross coupling delay characterization method of the FIG. 2.

FIG. 4 is a diagram illustrative of one embodiment of a simulation of interconnects and models 400 to obtain a noise waveform 406 in accordance with the cross coupling delay characterization method 200 of the FIG. 2. The Thevenin equivalent circuit 103 is used to model the aggressor 1 102 within the simulation of interconnects and models 400. A single Thevenin resistance ($R_{THEV}$) 402 is used, at this point, to model the victim driver 104 at this stage of the modeling. The resultant current signal generated at the output node of the victim driver 104 is shown by the total noise current ($I_{NOISE}$) 404 flowing into the output node adjacent to the physical location of the victim driver 104. Continuing to trace down the nets of the aggressor driver 1 102 and the victim driver 104, the resultant voltage signals are shown, at the nodes prior to the physical location of the victim receiver 120 by blocks 131 and 406, respectively. The victim receiver 120 is modeled, at this point, using the victim receiver model circuit 121 of the shunt capacitor to ground ($C_{REC}$). The noise waveform 406 is shown as having a negative anomaly at the node prior to the physical location of the victim receiver 120 modeled by the victim receiver model circuit 121 of the shunt capacitor to ground ($C_{REC}$). The noise waveform 406 is generated from the simulation of the interconnects and models 400.

Figure 5:
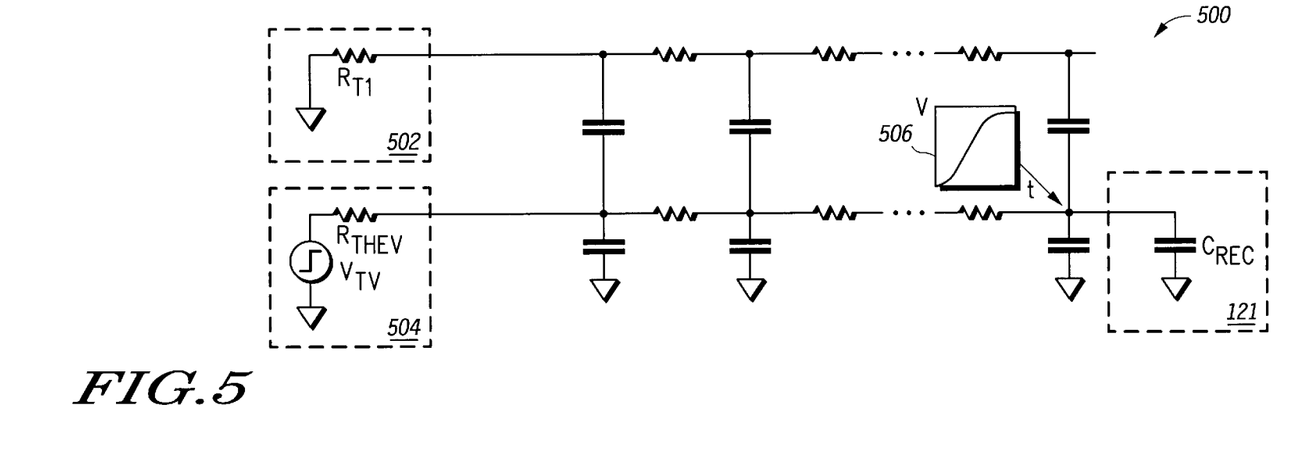
FIG. 5 is a diagram illustrative of one embodiment of a simulation of interconnects and models to obtain a noiseless victim transition waveform in accordance with the cross coupling delay characterization method of the FIG. 2.

FIG. 5 is a diagram illustrative of one embodiment of a simulation of interconnects and models 500 to obtain a noiseless victim transition waveform 506 in accordance with the cross coupling delay characterization method 200 of the FIG. 2. The aggressor driver 1 102 is modeled, at this point, as having being a single Thevenin resistance ($R_{T1}$) 502. The victim driver 104 is modeled, at his point, as a Thevenin equivalent circuit 504 having a switching voltage supply ($V_{TV}$) and a linear Thevenin resistance ($R_{THEV}$). Again the victim receiver 120 is modeled, at this point, as using the victim receiver model circuit 121 of the shunt capacitor to ground ($C_{REC}$). The noiseless victim transition waveform 506 is generated at the node immediately preceding the physical location of the victim receiver 120.

Figure 6:
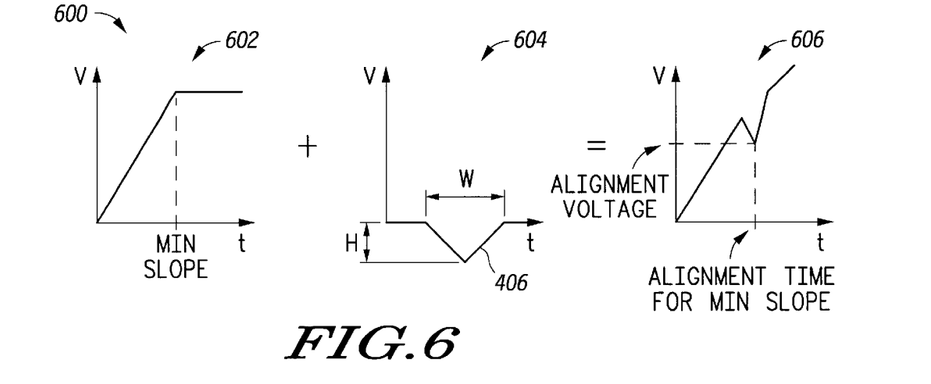
FIG. 6 is a diagram illustrative of one embodiment of a conversion of alignment voltage to alignment time (for a minimum slope) that is performed in accordance with the cross coupling delay characterization method of the FIG. 2.

FIG. 6 is a diagram illustrative of one embodiment of a conversion of alignment voltage to alignment time (shown specifically for a minimum slope) 600 that is performed in accordance with the cross coupling delay characterization method 200 of the FIG. 2. The conversion of alignment voltage to alignment time for a maximum slope would be directly analogous, with the exception that the maximum slope would be used as the initial input. Either of the conversions is capable of being performed without departing from the scope and spirit of the invention in an analogous fashion. A transition is shown in a block 602 having a minimum slope (MIN SLOPE). The transition of the block 602 is summed with a noise signal 604 that contains the noise waveform 406 shown above in the FIG. 4 in a way that the resultant waveform has the noise peak at the value of ALIGNMENT VOLTAGE. The ALIGNMENT VOLTAGE has been calculated by interpolations on the receiver table generated during pre-characterization. A resultant signal 606 is shown having the peak of an anomaly at the ALIGNMENT TIME for the minimum slope and a corresponding voltage (ALIGNMENT VOLTAGE). The ALIGNMENT TIME is the time when the resultant waveform 606 has the peak of an anomaly at the ALIGNMENT VOLTAGE.

Figure 7A:
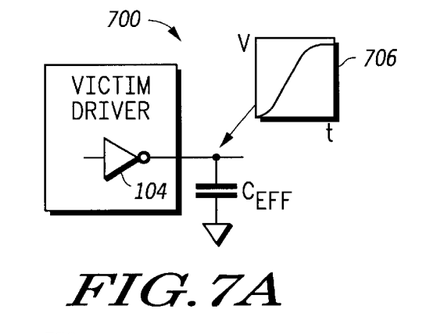
FIG. 7A is a diagram illustrative of one embodiment of a victim driver simulation using an effective capacitance that is performed in accordance with the cross coupling delay characterization method of the FIG. 2.

FIG. 7A is a diagram illustrative of one embodiment of a victim driver simulation 700 using an effective capacitance ($C_{EFF}$) that is performed in accordance with the cross coupling delay characterization method 200 of the FIG. 2. The victim driver 104 is modeled as driving the effective capacitance ($C_{EFF}$) shunted to ground and the transition 706 from low to high is generated at the node to which the effective capacitance ($C_{EFF}$) is connected.

Figure 7B:
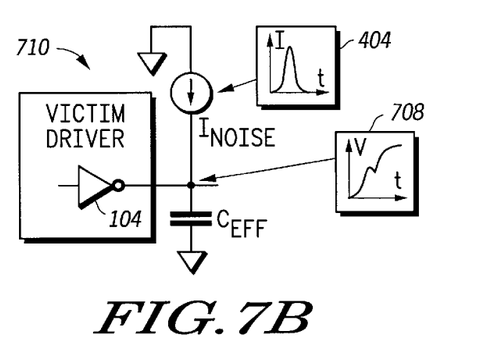
FIG. 7B is a diagram illustrative of one embodiment of a victim driver simulation using an effective capacitance and a noise current that is performed in accordance with the cross coupling delay characterization method of the FIG. 2.

FIG. 7B is a diagram illustrative of one embodiment of a victim driver simulation 710 using an effective capacitance ($C_{EFF}$) shunted to ground and the noise current 404 that is performed in accordance with the cross coupling delay characterization method 200 of the FIG. 2. The victim driver 104 is modeled as driving the effective capacitance ($C_{EFF}$) shunted to ground. In addition, the noise current ($I_{NOISE}$) 404 generated during the simulation shown in FIG. 4 is injected, at this point, to the node to which the effective capacitance ($C_{EFF}$) is connected. The resultant transition 708, having an anomaly, from low to high is generated at the node to which the effective capacitance ($C_{EFF}$) and at which the noise current ($I_{NOISE}$) 404 is injected.

Figure 7C:
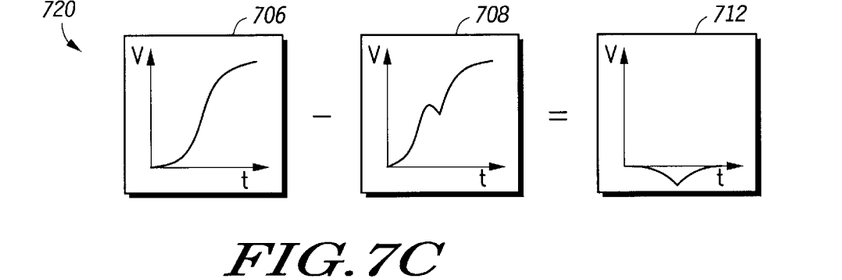
FIG. 7C is a diagram illustrative of one embodiment of a calculation of a difference between the victim driver simulations of the FIG. 7A and the FIG. 7B that is performed in accordance with the cross coupling delay characterization method of the FIG. 2.

FIG. 7C is a diagram illustrative of one embodiment of a calculation of a difference 720 between the victim driver simulations of the FIG. 7A and the FIG. 7B that is performed in accordance with the cross coupling delay characterization method 200 of the FIG. 2. The transition 708, generated during the modeling as shown in the FIG. 7B, is subtracted from the transition 706, generated during the modeling as shown in the FIG. 7A to generate the difference signal 712. The difference signal 712 is shown as having a negative peak approximately at the location of the anomaly within the resultant transition 708 that is generated within the FIG. 7B.

Figure 7D:
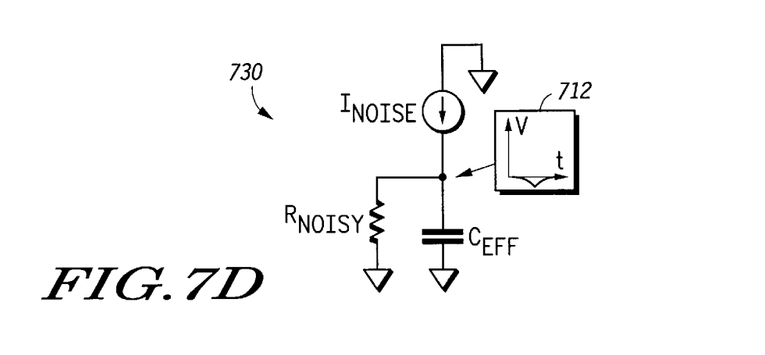
FIG. 7D is a diagram illustrative of one embodiment of a calculation of a noisy resistance using a voltage waveform, an effective capacitance, and a noise current that is performed in accordance with the cross coupling delay characterization method of the FIG. 2.

FIG. 7D is a diagram illustrative of one embodiment of a calculation of a noisy resistance ($R_{NOISY}$) using a voltage waveform, specifically the difference signal 712 that is generated within the FIG. 7C, performed in accordance with the cross coupling delay characterization method 200 of the FIG. 2. A current ($I_{NOISE}$) is injected at the node to which the effective capacitance ($C_{EFF}$) is shunted to ground. The value of the noisy resistance ($R_{NOISY}$) is calculated such that the node to which the current ($I_{NOISE}$) is injected has the same waveform as the difference signal 712. The noisy resistance ($R_{NOISY}$) is used to model the victim driver in accordance with the present invention.

Figure 8:
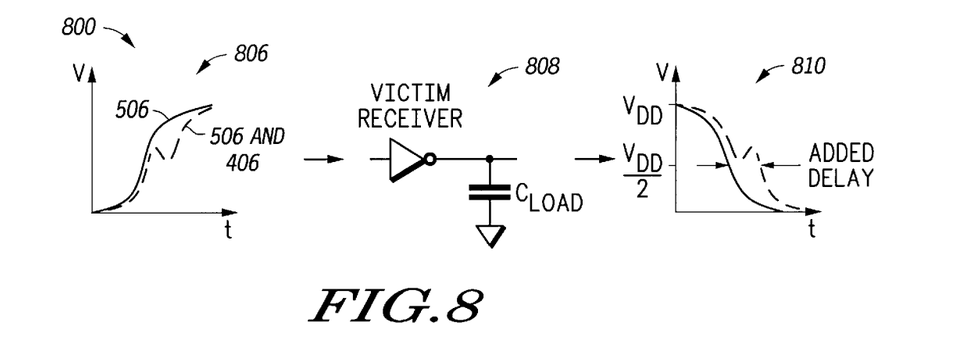
FIG. 8 is a diagram illustrative of one embodiment of a simulation of a victim receiver that is performed in accordance with the cross coupling delay characterization method of the FIG. 2.

FIG. 8 is a diagram illustrative of one embodiment of a simulation of a victim receiver that is performed in accordance with the cross coupling delay characterization method 200 of the FIG. 2. A transition 806 is shown as being either the noiseless victim transition waveform 506 generated as shown in the FIG. 5, or as being the noisy waveform calculated as the sum of the noiseless victim transition waveform 506 and the noise waveform 406 generated as shown in the FIG. 4. Both of these are in turn fed into the victim receiver that is itself communicatively coupled to a capacitive load ($C_{LOAD}$) as shown in a block 808. Using the noiseless victim transition waveform 506 as the victim receiver input, the resultant noise voltage signal 810 is a smooth transition from high to low, but the use of the noisy waveform as the victim receiver input generates the resultant waveform as a transition from high to low with an anomaly. The time difference of the two resultant waveforms at the voltage value of half a maximum voltage ($V_{DD}/2$) is measured as the ADDED DELAY at the victim receiver output due to capacitive coupling noise.

Figure 9:
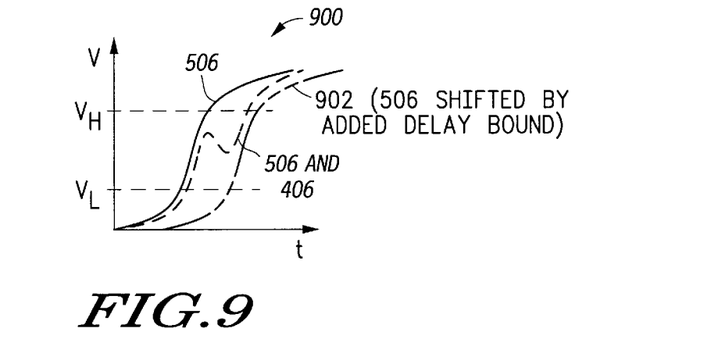
FIG. 9 is a diagram illustrative of one embodiment of a calculation of an added delay bound that is performed in accordance with the cross coupling delay characterization method of the FIG. 2.

FIG. 9 is a diagram illustrative of one embodiment of a calculation of an added delay bound 900 that is performed in accordance with the cross coupling delay characterization method 200 of the FIG. 2. The noiseless victim transition waveform 506, as well as the noisy waveform calculated as the sum of the noiseless victim transition waveform 506 and the noise waveform 406 are shown in the diagram. A low voltage ($V_L$) and a high voltage ($V_H$) are determined to signify the first and the second bound, respectively. When desired by the specific application, a victim transition waveform 902 is calculated such that the noiseless victim transition waveform 506 is shifted by an amount such that each point of the noiseless victim transition waveform between the first and second bounds lies beyond each point of the noisy waveform, wherein the shifted amount indicates the ADDED DELAY BOUND. Herein, an accurate delay characterization of the integrated circuit is performed including the added delay bound for which a designer can expect extra delays due to capacitive coupling of the integrated circuit in various embodiments and applications. This additional information pertaining to the delay characterization of the integrated circuit is provided to a designer of a system into which the integrated circuit is to be used.

It is appreciated that the virtual circuitry shown above in the FIGS. 3–9 are used to perform accurate modeling of the integrated circuit to determine the delay characterization of the integrated circuit. At various times during the modeling, the various circuits are used to model various segments and operations to be performed within the cross coupling delay characterization method 200 of the FIG. 2. This invention provides a way to perform delay characterization of an integrated circuit in a much more computationally efficient manner when compared with existing methods. In addition, not only are much less mathematical processing resources required to perform the method, but much less memory must be dedicated to storage of the characterization of various devices within the integrated circuit, i.e., the victim receiver shown in the FIG. 3.

Figure 10:
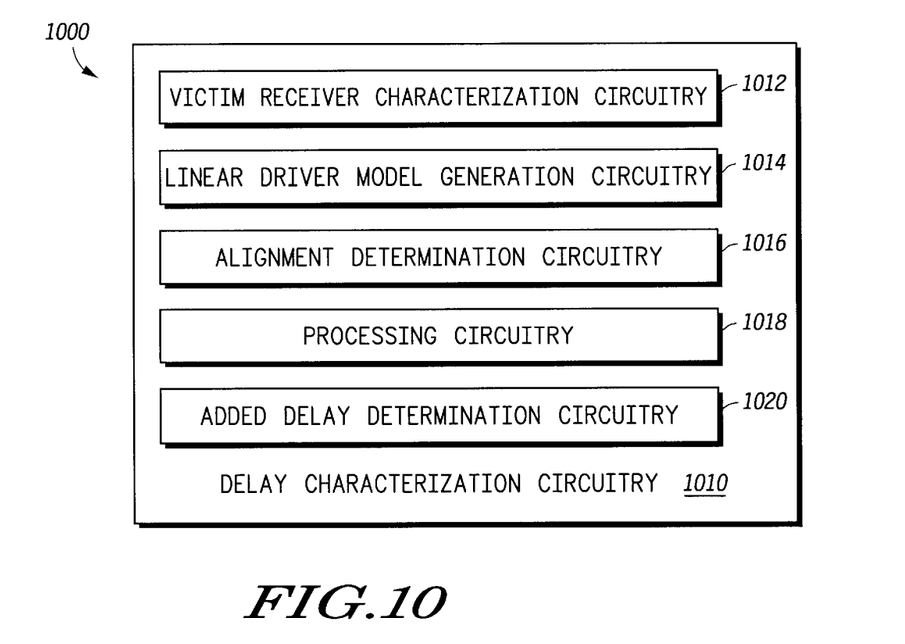
FIG. 10 is a system diagram illustrating one embodiment of a delay characterization system built in accordance the present invention.

FIG. 10 is a system diagram illustrating one embodiment of a delay characterization system 1000 built in accordance the present invention. The delay characterization system 1000 employs a delay characterization circuitry 1010 to perform the delay characterization within an integrated circuit. The delay characterization circuitry 1010 itself contains, among other things, a victim receiver characterization circuitry 1012, a linear driver model generation circuitry 1014, an alignment determination circuitry 1016, a processing circuitry 1018, and an added delay determination circuitry 1020.

From certain perspectives, the delay characterization system 1000 is operable to perform the cross coupling delay characterization method of the FIG. 2. In addition, the various circuitries included within the delay characterization circuitry 1010 are operable to perform the various embodiments of the invention included above in the description of the FIGS. 1–9. In other embodiments of the invention, the delay characterization system 1000 is included in a data processing system. In even other embodiments of the invention, the delay characterization system 1000 is included in computer processing system.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. In a cross-coupled network having at least one aggressor net having an aggressor driver and a victim net having a victim driver and a victim receiver, a method of characterizing the victim receiver, comprising:

determining a first characterization point;

providing to the victim receiver a first plurality of input waveforns associated with the first characterization point, each input waveform having a corresponding output waveform, wherein each input waveform is based upon a first noiseless transition and a first noise pulse and has a first corresponding noise alignment value; and calculating a first delay corresponding to each of the output waveforms.

2. The method of claim 1, further comprising:

using the first delays to determine a worst delay; and determining a one of the first corresponding noise alignment values corresponding to the output waveform whose first delay falls within a predetermined range, wherein the predetermined image is based on the worst delay.

3. The method of claim 2, wherein the one of the first corresponding noise alignment values corresponds to the output waveform having the worst delay.

4. The method of claim 2, further comprising storing alignment information corresponding to the one of the first corresponding noise alignment values.

5. The method of claim 4, wherein the alignment information includes at least one of an alignment time and an alignment voltage.

6. The method of claim 5, wherein the alignment information is capable of being translated between alignment time and alignment voltage.

7. The method of claim 1, wherein the first characterization point is based at least in part on a slope of the first noiseless transition.

8. The method of claim 7, wherein the first characterization point is based at least in part on one of a minimum and a maximum slope of the first noiseless transition.

9. The method of claim 7, wherein the first characterization point is based further in part on a height of the first noise pulse and a width of the first noise pulse.

10. The method of claim 9, wherein the first characterization point is based further in part on one of a maximum and a minimum height of the first noise pulse and one of a maximum and a minimum width of the first noise pulse.

11. The method of claim 9, wherein:
for each input waveform, the first noise pulse has a same height and a same width, and the first noiseless transition has a same slope; and
the first corresponding noise alignment value differs for each input waveform.

12. The method of claim 1, further comprising:
determining a second characterization point;
providing to the victim receiver a second plurality of input waveforms associated with the second characterization point, each of the second plurality of input waveforms having a corresponding output waveform, wherein each of the second plurality of input waveforms is based upon a second noiseless transition and a second noise pulse and has a second corresponding noise alignment value; and
calculating a second delay corresponding to each of the output waveforms.

13. The method of claim 12, further comprising:
using the first delays to determine a first worst delay;
using the second delays to determined a second worst delay;
determining a one of the first corresponding noise alignment values corresponding to the output waveform whose first delay falls within a first predetermined range, wherein the first predetermined range is based on the first worst delay; and
determining a one of the second corresponding noise alignment values corresponding to the output waveform whose second delay falls within a second predetermined range, wherein the second predetermined range is based on the second worst delay.

14. The method of claim 13, further comprising storing alignment information corresponding to the one of the corresponding first noise alignment values and the one of the corresponding second noise alignment values.

15. The method of claim 12, wherein:
the first characterization point is based at least in part on one of a minimum and maximum slope of the first noiseless transition, one of a minimum and maximum height of the first noise pulse, and one of a minimum and maximum width of the first noise pulse; and
the second characterization point is based at least in part on one of a minimum and maximum slope of the second noiseless transition, one of a minimum and maximum height of the second noise pulse, and one of a minimum and maximum width of the second noise pulse.

16. The method of claim 1, further comprising:
creating a receiver characterization table based upon a plurality of characterization points, including the first characterization point, wherein the receiver characterization table includes alignment information corresponding to each of the plurality of characterization points.

17. The method of claim 16, wherein each characterization point is based on at least one of a slope of a corresponding noiseless transition, a height of a corresponding noise pulse, and a width of the corresponding noise pulse.

18. The method of claim 17, wherein each characterization point is based on at least two of the slope of the corresponding noiseless transition, the height of the corresponding noise pulse, and the width of the corresponding noise pulse.

19. The method of claim 16, wherein the alignment information corresponds to a worst delay corresponding to each of the plurality of characterization points.

20. The method of claim 16, wherein an alignment of a waveform is calculated by performing a plurality of interpolations on the receiver characterization table in terms of its characterization points.

21. The method of claim 1, wherein the victim receiver has an output loading wherein the output loading represents a minimum parasitic loading effect.

22. A computer readable medium comprising a plurality of instructions for implementing the method of claim 1.

23. In a cross-coupled network having at least one aggressor net and a victim net having a victim driver and a victim receiver, a method of modeling the victim driver comprising:
simulating the victim driver having an effective capacitance loading to obtain a first output waveform;
simulating the victim driver having the effective capacitance loading and coupled to a noise source to obtain a second output waveform, wherein the noise source represents at least in part the noise impact of the at least one aggressor net;
calculating a first noise voltage waveform as a difference between the first and second output waveforms; and
using the first noise voltage waveform to calculate a noisy resistance for use in modeling the victim driver to obtain a first victim driver model.

24. The method of claim 23, wherein the noise source includes a noise current source.

25. The method of claim 24, wherein the noise current source has an associated first noise alignment.

26. The method of claim 25, wherein the first noise alignment is determined based at least in part on a characterization of the victim receiver.

27. The method of claim 26, wherein the determination is made by performing an interpolation using the characterization of the victim driver.

28. The method of claim 26, wherein the characterization is based on at least one of a transition slope at an input of the victim receiver, a noise pulse width, and a noise pulse height.

29. The method of claim 25, further comprising:
simulating the cross-coupled network using the first victim driver model to obtain a second noise alignment;
comparing a difference between the first and second noise alignments to a predetermined tolerance; and
if the difference is above the predetermined tolerance, calculating an updated noisy resistance to obtain a second victim driver model.

30. The method of claim 24, wherein the noise current source introduces a current at the output of the victim driver.

31. The method of claim 23, wherein the first victim driver model is a linear driver model.

32. The method of claim 23, further comprising:
simulating the cross-coupled network using the first victim driver model to obtain a first noisy transition; and
simulating the victim receiver using the first noisy transition to obtain an added delay at an output of the victim receiver.

33. The method of claim 23, further comprising:
calculating an added delay of the victim net by using an analytical bound to define a range of points corresponding to a waveform of the first victim driver model.

34. The method of claim 23, wherein the cross-coupled network includes a plurality of aggressor nets, and the noise source represents, at least in part, the noise impact of the plurality of aggressor nets.

35. A computer readable medium comprising a plurality of instructions for implementing the method of claim 23.

36. In a cross-coupled network having at least one aggressor net having an aggressor driver and a victim net having a victim driver and a victim receiver, a method of determining an added delay in a transition of the victim receiver caused by a transition of the aggressor driver, said method comprising:

obtaining a noisy waveform corresponding to the victim receiver, wherein the noisy waveform is based at least in part upon a noiseless transition waveform and a noise pulse;

determining a first and a second bound;

shifting the noiseless transition waveform by an amount such that each point of the noiseless transition waveform lies beyond each point of the noisy waveform between the first and second bounds, wherein the shifted amount indicates the added delay.

37. The method of claim 36, wherein the first bound is one of a low voltage and a high voltage and the second bound is the other one of the low voltage and the high voltage.

38. In a cross-coupled network having at least one aggressor net having an aggressor driver and a victim net having a victim driver and a victim receiver, a method of determining an added delay of the victim net caused at least in part by the aggressor net, comprising:

characterizing the victim receiver to obtain a victim receiver characterization;

calculating a first noise alignment based upon the victim receiver characterization and a first driver model of the victim driver; and using a first noise source, corresponding at least in part to the aggressor net and the first alignment, to create a second victim driver model.

39. The method of claim 38, further comprising:

calculating a second noise alignment time based upon the victim receiver characterization and the second victim driver model; and if a difference between the first and second noise alignment times is above a predetermined threshold, using a second noise source, corresponding at least in part to the aggressor net and the second alignment, to create a third victim driver model.

40. The method of claim 39, wherein the first victim driver model includes a first resistance, the second driver model includes a second resistance, and the third driver model includes a third resistance, wherein each of the first, second, and third resistances has a different value.

41. The method of claim 39 further comprising, if the difference is not above the predetermined threshold, calculating an added delay time for the victim net based upon the second victim driver model, wherein the added delay is calculated at an output of the victim receiver.

42. The method of claim 38, further comprising calculating an added delay time for the victim net based upon the second victim driver model, wherein the added delay is calculated at an output of the victim receiver.

43. A computer readable medium comprising a plurality of instructions for performing the method of claim 38.

* * * * *

UNITED STATES PATENT AND TRADEMARK OFFICE
CERTIFICATE OF CORRECTION

PATENT NO.        : 6,799,153 B1                                              Page 1 of 1
APPLICATION NO.   : 09/553271
DATED             : April 20, 2000
INVENTOR(S)       : Supamas Sirichotiyakul It is certified that error appears in the above-identified patent and that said Letters Patent is hereby corrected as shown below:

In Column 10, Line 33, Claim No. 1:
    Change "waveforns" to --waveforms--

In Column 13, Line 14, Claim No. 36:
    Change "receiver, wherein" to --receiver gate, wherein--

Signed and Sealed this

First Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 6,799,153 B1 Page 1 of 1
APPLICATION NO. : 09/553271
DATED : September 28, 2004
INVENTOR(S) : Supamas Sirichotiyakul It is certified that error appears in the above-identified patent and that said Letters Patent is hereby corrected as shown below:

In Column 10, Line 33, Claim No. 1:
    Change "waveforns" to --waveforms--

In Column 13, Line 14, Claim No. 36:
    Change "receiver, wherein" to --receiver gate, wherein--

This certificate supersedes the Certificate of Correction issued April 1, 2008.

Signed and Sealed this

Sixth Day of May, 2008

JON W. DUDAS
*Director of the United States Patent and Trademark Office*